(12) United States Patent
Kawai

(10) Patent No.: US 10,618,206 B2
(45) Date of Patent: Apr. 14, 2020

(54) RESIN-MOLDED ELECTRONIC DEVICE WITH DISCONNECT PREVENTION

(71) Applicant: OMRON Corporation, Kyoto-shi, Kyoto (JP)

(72) Inventor: Wakahiro Kawai, Konan (JP)

(73) Assignee: OMRON Corporation, Kyoto-shi (JP)

( * ) Notice: Subject to any disclaimer, the term of this patent is extended or adjusted under 35 U.S.C. 154(b) by 0 days.

(21) Appl. No.: 16/464,704

(22) PCT Filed: Nov. 16, 2017

(86) PCT No.: PCT/JP2017/041269
§ 371 (c)(1),
(2) Date: May 29, 2019

(87) PCT Pub. No.: WO2018/154879
PCT Pub. Date: Aug. 30, 2018

(65) Prior Publication Data
US 2019/0322015 A1 Oct. 24, 2019

(30) Foreign Application Priority Data

Feb. 27, 2017 (JP) .................................. 2017-034684

(51) Int. Cl.
*B29C 45/14* (2006.01)
*H01C 1/034* (2006.01)
(Continued)

(52) U.S. Cl.
CPC ............ *B29C 45/14* (2013.01); *H01C 1/034* (2013.01); *H01C 1/14* (2013.01); *H01C 17/006* (2013.01);
(Continued)

(58) Field of Classification Search
None
See application file for complete search history.

(56) References Cited

U.S. PATENT DOCUMENTS 4,664,644 A * 5/1987 Kumata ................ B29C 53/585
156/172
4,697,203 A * 9/1987 Sakai ..................... G11C 16/18
174/529
(Continued)

FOREIGN PATENT DOCUMENTS

| JP | H07-66570 A | 3/1995 |
|---|---|---|
| JP | 2002-246722 A | 8/2002 |

(Continued)

OTHER PUBLICATIONS

JP2011077230_English_Specification. Espacenet. (Year: 2011).*
(Continued)

*Primary Examiner* — Timothy J Thompson
*Assistant Examiner* — Muhammed Azam
(74) *Attorney, Agent, or Firm* — Metrolex IP Law Group, PLLC

(57) ABSTRACT

An electronic device includes an electronic component having electrodes, a resin molded body embedding the electronic component such that the electrodes are exposed, a resin member interposed between the resin molded body and the electronic component and exposed from the resin molded body, and wires formed on the resin molded body and the resin member and respectively connected to the electrodes. A thermal expansion coefficient of the resin member is lower than a thermal expansion coefficient of the resin molded body and is higher than a thermal expansion coefficient of the electrodes.

6 Claims, 6 Drawing Sheets

(51) Int. Cl.
*H01C 1/14* (2006.01)
*H01C 17/00* (2006.01)
*H01G 2/10* (2006.01)
*H01G 13/00* (2013.01)
*H01L 21/56* (2006.01)
*H01L 23/31* (2006.01)
*H01L 23/00* (2006.01)
*B29L 31/34* (2006.01)

(52) U.S. Cl.
CPC ........... *H01G 2/103* (2013.01); *H01G 13/003* (2013.01); *H01L 21/565* (2013.01); *H01L 21/568* (2013.01); *H01L 23/3185* (2013.01); *H01L 24/05* (2013.01); *B29C 2045/1486* (2013.01); *B29L 2031/34* (2013.01)

(56) References Cited

U.S. PATENT DOCUMENTS

| | | | | |
|---|---|---|---|---|
| 4,788,583 A * | 11/1988 | Kawahara | H01L 23/3135 | 257/670 |
| 4,970,575 A * | 11/1990 | Soga | H01L 23/293 | 257/688 |
| 4,993,895 A * | 2/1991 | Nordstrom | B23B 49/00 | 269/287 |
| 5,539,253 A * | 7/1996 | Nagaune | H01L 23/24 | 257/687 |
| 5,962,925 A * | 10/1999 | Eifuku | H01L 21/563 | 257/738 |
| 5,981,313 A * | 11/1999 | Tanaka | H01L 21/563 | 257/788 |
| 6,258,191 B1 * | 7/2001 | Fasano | H01L 21/481 | 156/89.12 |
| 6,281,571 B1 * | 8/2001 | Takashima | H01L 23/49816 | 257/698 |
| 6,835,592 B2 * | 12/2004 | Hall | H01L 21/565 | 257/712 |
| 7,105,919 B2 * | 9/2006 | Kim | H01L 23/13 | 257/693 |
| 7,442,581 B2 * | 10/2008 | Lytle | B29C 33/301 | 438/118 |
| 7,642,137 B2 * | 1/2010 | Lin | H01L 21/563 | 438/127 |
| 8,203,222 B2 * | 6/2012 | Watanabe | H01L 21/561 | 257/686 |
| 8,525,041 B2 * | 9/2013 | Shimizu | H01L 23/5384 | 174/260 |
| 8,735,739 B2 * | 5/2014 | Ishihara | H05K 3/4691 | 174/255 |
| 8,975,116 B2 * | 3/2015 | Ostmann | H01L 21/4832 | 257/E23.02 |
| 9,113,575 B2 * | 8/2015 | Shimizu | H05K 1/188 | |
| 9,497,863 B2 * | 11/2016 | Kusama | H05K 1/185 | |
| 9,824,900 B2 * | 11/2017 | Kodama | C03C 8/02 | |
| 9,997,430 B2 * | 6/2018 | Omura | H01L 24/32 | |
| 10,375,867 B2 * | 8/2019 | Kawai | H05K 9/0084 | |
| 2001/0045643 A1 * | 11/2001 | Katoh | H01L 23/16 | 257/706 |
| 2002/0041310 A1 * | 4/2002 | Kaneko | B41J 2/14024 | 347/65 |
| 2002/0056906 A1 * | 5/2002 | Kajiwara | H01L 24/11 | 257/697 |
| 2002/0068382 A1 * | 6/2002 | Murakami | H01L 21/563 | 438/108 |
| 2004/0055783 A1 * | 3/2004 | Masuda | H01L 23/3107 | 174/252 |
| 2005/0029658 A1 * | 2/2005 | Sugiyama | H01L 23/142 | 257/747 |
| 2005/0116322 A1 * | 6/2005 | Sando | H01L 23/3135 | 257/676 |
| 2006/0065421 A1 * | 3/2006 | Arai | H01L 21/565 | 174/524 |
| 2006/0255440 A1 * | 11/2006 | Miyazaki | H01L 23/49822 | 257/679 |
| 2007/0108610 A1 | 5/2007 | Kondo | | |
| 2007/0139899 A1 * | 6/2007 | Van Schuylenbergh | H01L 23/22 | 361/760 |
| 2010/0107438 A1 * | 5/2010 | Bringewatt | D06F 39/006 | 34/467 |
| 2011/0084384 A1 * | 4/2011 | Sakata | H01L 21/563 | 257/737 |
| 2012/0300404 A1 * | 11/2012 | Arimai | H05K 3/284 | 361/707 |
| 2013/0240909 A1 * | 9/2013 | Hiramatsu | H01L 23/24 | 257/77 |
| 2014/0144686 A1 | 5/2014 | Shimizu | | |
| 2017/0018474 A1 * | 1/2017 | Kim | H01L 23/3121 | |
| 2017/0103950 A1 * | 4/2017 | Kawai | B29C 45/14 | |
| 2018/0092215 A1 | 3/2018 | Kawai | | |

FOREIGN PATENT DOCUMENTS

| | | | |
|---|---|---|---|
| JP | 2004-111502 A | 4/2004 | |
| JP | 2007-150275 A | 6/2007 | |
| JP | 2010-114221 A | 5/2010 | |
| JP | 2010-272756 A | 12/2010 | |
| JP | 2011-77230 A | 4/2011 | |
| JP | 2011-077230 A | 4/2011 | |
| JP | 2014-107431 A | 6/2014 | |
| JP | 2016-201521 A | 12/2016 | |
| TW | 201644341 A | 12/2016 | |
| WO | 2016/167081 A1 | 10/2016 | |

OTHER PUBLICATIONS

Appendix_3_Thermal_Expansion_on_Elasticity. Glass:Mechanics and Technology. Eric Le Bourhis. (Year: 2007).*
An English translation of the International Search Report ("ISR") of PCT/JP2017/041269 dated Feb. 3, 2018.
The International Searching Authority ("ISA") Written Opinion ("WO") of PCT/JP2017/041269 dated Feb. 6, 2018.
Taiwan Office Action ("TWOA") dated Jul. 19, 2018 in a corresponding Taiwan Application.

* cited by examiner

RESIN-MOLDED ELECTRONIC DEVICE WITH DISCONNECT PREVENTION

TECHNICAL FIELD

The present technique relates to an electronic device having an electronic component embedded in a resin molded body, and a method for manufacturing the same.

BACKGROUND ART

In recent years, there has been a growing demand for implementing portable electronic apparatuses, small-sized sensors, or healthcare apparatuses (such as an electronic thermometer and a sphygmomanometer) as thin, lightweight, downsized, and highly water-resistant wearable products, at low cost.

Generally, such an electronic apparatus is formed by mounting a passive component (such as a resistor and a capacitor), an active component (such as an LSI (Large-Scale Integration) and an IC (Integrated Circuit)), a power supply device (such as a battery), a display device (such as an LED (Light Emitting Diode)), and other electronic components (such as a sensor and a switch) on a printed circuit board. Conventionally, such a printed circuit board is manufactured by a method of forming a wire circuit by etching copper foil stacked on a plate made of epoxy resin reinforced by glass fibers (a glass epoxy board) or on a sheet made of polyimide (a flexible printed board). Further, an electronic component is mounted to the wire circuit on this board by using solder, an electrically conductive adhesive, a metal wire, or the like.

However, in the conventional printed circuit board having the wire circuit formed by etching copper foil stacked on a glass epoxy board or a flexible printed board, cost such as material cost and processing cost is high. Further, waste liquid originated from etching processing imposes a heavy load on the environment. Furthermore, it is costly to mount the electronic component using solder, an electrically conductive adhesive, a metal wire, or the like.

In order to mount a plurality of electronic components on such a printed circuit board, it is necessary to provide a space having a predetermined distance or more between the electronic components, resulting in an increased size of the board itself. Further, when the printed board is attached to a structural component such as a case made of resin, a certain amount of space is required between the board and the structural component, resulting in an increased thickness of a product or limited downsizing of a product.

As described above, in order to implement a thinner, downsized, and lower-cost electronic apparatus, a method of assembling an electronic component without using a commonly-used conventional printed circuit board is required.

Japanese Patent Laying-Open No. 7-66570 (PTL 1), Japanese Patent Laying-Open No. 2004-111502 (PTL 2), and Japanese Patent Laying-Open No. 2010-272756 (PTL 3) each disclose a technique for implementing an electronic apparatus without requiring such a printed circuit board, specifically, a technique of embedding an electronic component in a resin molded body such that electrodes are exposed, and forming wires connected to the electrodes on the resin molded body. However, generally, a metal constituting the electrodes and the resin molded body have thermal expansion coefficients different from each other. Accordingly, when a change in shape due to expansion or contraction occurs in the resin molded body, cracks may occur between the resin molded body and the electrodes made of the metal, and disconnection may occur in the wires at positions overlapping the cracks.

As a method for solving such a conventional problem, Japanese Patent Laying-Open No. 2016-201521 (PTL 4) discloses a technique of forming a groove around an electronic component in a resin molded body and providing wires to pass in the groove.

FIG. 5A is a plan view showing a circuit structural body 100 disclosed in Japanese Patent Laying-Open No. 2016-201521. FIG. 5B shows a cross sectional view taken along a line X-X in FIG. 5A and viewed in the direction of arrows. Circuit structural body 100 includes an electronic component 110, a resin molded body 120 embedding electronic component 110, and wires 140 and 141 respectively connected to electrodes 111 and 112 of electronic component 110. A groove 130 is formed around electronic component 110 in resin molded body 120 Wires 140 and 141 are formed by applying an electrically conductive liquid ink to pass in groove 130. Thereby, even when expansion occurs in resin molded body 120 below wires 140 and 141, groove 130 is enlarged accordingly. On this occasion, recesses 142 and 143 formed in wires 140 and 141 are enlarged. Thereby, it is possible to make disconnection of the wires less likely to occur.

CITATION LIST

Patent Literature

PTL 1: Japanese Patent Laying-Open No. 7-66570
PTL 2: Japanese Patent Laying-Open No. 2004-111502
PTL 3: Japanese Patent Laying-Open No. 2010-272756
PTL 4: Japanese Patent Laying-Open No. 2016-201521

SUMMARY OF INVENTION

Technical Problem

In circuit structural body 100 disclosed in Japanese Patent Laying-Open No. 2016-201521, however, if groove 130 becomes larger than an appropriate size, the following problems arise.

FIG. 6A is a plan view showing circuit structural body 100 having groove 130 larger than an appropriate size formed therein. FIG. 6B shows a cross sectional view taken along a line X-X in FIG. 6A and viewed in the direction of arrows. When groove 130 becomes large, a level difference between a bottom surface of groove 130 and electrodes 111 and 112 of electronic component 110 becomes large, and a wire 140a in groove 130 is disconnected from a wire 140b on electrode 111. Similarly, a wire 141a in groove 130 is disconnected from a wire 141b on electrode 112. Further, as the electrically conductive ink flows in groove 130, thin wire portions 144 and 145 are respectively produced in wires 140a and 141a passing in groove 130, making disconnection more likely to occur. Although these problems can be solved by increasing an application amount of the electrically conductive ink to be supplied into groove 130, there is a possibility that the electrically conductive ink in a large amount may flow around electronic component 110 and a short circuit 146 which short-circuits wires 140 and 141 may be formed.

The present invention has been made by focusing on the aforementioned problems, and an object thereof is to provide an electronic device in which disconnection of wires connected to an electronic component embedded in a resin molded body is less likely to occur, and a method for manufacturing the same.

Solution to Problem

According to an aspect, an electronic device includes an electronic component having electrodes, a resin molded body embedding the electronic component such that the electrodes are exposed, a resin member interposed between the resin molded body and the electronic component and exposed from the resin molded body, and wires formed on the resin molded body and the resin member and connected to the electrodes.

Preferably, a thermal expansion coefficient of the resin member is lower than a thermal expansion coefficient of the resin molded body and is higher than a thermal expansion coefficient of the electrodes.

Preferably, a bending elastic modulus of the resin member is less than or equal to 1300 MPa.

Preferably, the resin member has voids therein. The electronic device further includes electrically conducting paths formed within the voids and connected to the wires and the electrodes.

According to another aspect, a method for manufacturing the electronic device described above includes: a first step of arranging the electronic component on a sheet having a surface on which an adhesive liquid layer is applied, and forming a wetting portion around the electronic component by wetting of the liquid layer along side surfaces of the electronic component; a second step of curing the wetting portion and forming the resin member; a third step of injecting a resin material onto the surface of the sheet on which the electronic component is arranged and molding the resin molded body, after forming the resin member; a fourth step of peeling the sheet from the resin molded body such that the resin member remains between the resin molded body and the electronic component; and a fifth step of forming the wires on the resin molded body and the resin member.

Preferably, the liquid layer contains a volatile substance, and voids are formed inside the resin member by volatilizing the volatile substance when curing the wetting portion in the second step. Electrically conducting paths connected to the wires and the electrodes are formed inside the resin member by infiltrating an electrically conductive material constituting the wires into the voids in the fifth step.

According to another aspect, a method for manufacturing the electronic device described above includes: a first step of arranging the electronic component on a sheet having a surface on which an adhesive liquid layer is applied, and forming a wetting portion around the electronic component by wetting of the liquid layer along side surfaces of the electronic component; a second step of curing the wetting portion; a third step of injecting a first resin material onto the surface of the sheet on which the electronic component is arranged, and thereby molding the resin molded body embedding the electronic component; a fourth step of peeling the sheet and the wetting portion from the resin molded body, and thereby forming a groove conforming to a shape of the wetting portion around the electronic component in the resin molded body; a fifth step of supplying a second resin material to fill the groove, curing the second resin material, and forming the resin member; and a sixth step of forming the wires on the resin molded body and the resin member.

Preferably, the second resin material contains a volatile substance, and voids are formed inside the resin member by volatilizing the volatile substance when curing the second resin material in the fifth step. Electrically conducting paths connected to the wires and the electrodes are formed inside the resin member by infiltrating an electrically conductive material constituting the wires into the voids in the sixth step.

Advantageous Effects of Invention

According to the present disclosure, disconnection of wires connected to an electronic component embedded in a resin molded body is less likely to occur.

DESCRIPTION OF EMBODIMENTS

Figure 1A:
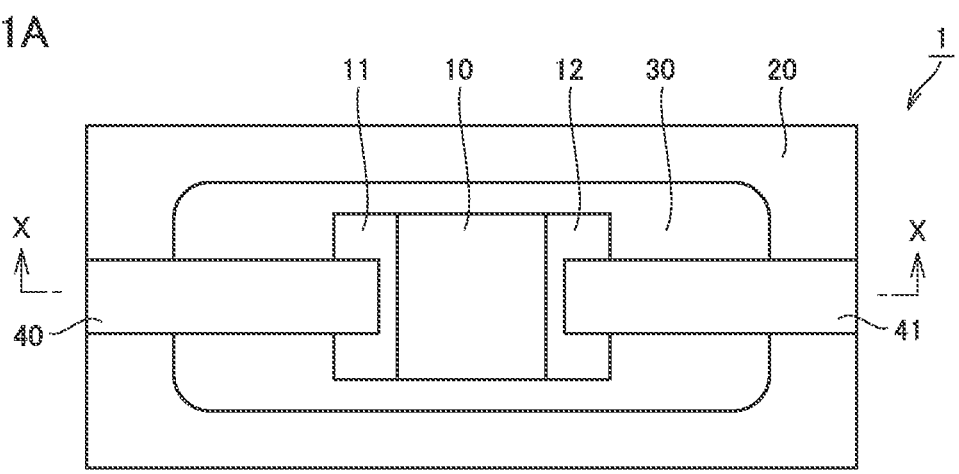
FIG. 1A is a plan view showing a schematic configuration of an electronic device in accordance with a first embodiment.

Embodiments of the present invention will be described in detail with reference to the drawings. It should be noted that identical or corresponding parts in the drawings will be designated by the same reference numerals, and the description thereof will not be repeated. In addition, the embodiments or variations described below may be selectively combined as appropriate.

First Embodiment (Structure of Electronic Device)

Figure 1B:
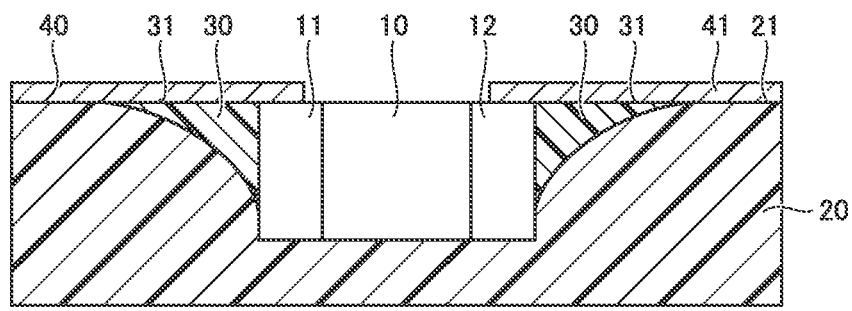
FIG. 1B is a cross sectional view taken along a line X-X in FIG. 1A and viewed in the direction of arrows.

FIG. 1A is a plan view showing a schematic configuration of an electronic device 1 in accordance with a first embodiment. FIG. 1B shows a cross sectional view taken along a line X-X in FIG. 1A and viewed in the direction of arrows. FIGS. 1A and 1B show a portion of electronic device 1 showing the periphery of one electronic component 10.

As shown in FIGS. 1A and 1B, electronic device 1 includes electronic component 10, a resin molded body 20, a resin member 30, and wires 40 and 41.

Electronic component 10 is a component selected from a passive component (such as a resistor and a capacitor), an active component (such as an LSI and an IC), a power supply device (such as a battery), a display device (such as an LED), a sensor, a switch, and the like. In the following, chip-type electronic component 10 having electrodes 11 and 12 will be described as an example. Although FIGS. 1A and 1B show only one electronic component 10, the number of electronic components 10 included in electronic device 1 is not be limited to one, and may be plural. Further, the type of electronic component 10 is not particularly limited, either.

Electrodes 11 and 12 of electronic component 10 are mainly composed of copper (thermal expansion coefficient: $1.7 \times 10^{-5}$/K) or silver (thermal expansion coefficient: $1.9 \times 10^{-5}$/K) and plated with nickel and tin, for example.

Resin molded body 20 is plate-shaped, and is made of resin such as polycarbonate (PC) (thermal expansion coefficient: $5.6 \times 10^{-5}$/K) or acrylonitrile butadiene styrene (ABS) (thermal expansion coefficient: 6 to $13 \times 10^{-5}$/K). It should be noted that the shape of resin molded body 20 is not particularly limited. The material for resin molded body 20 may be another type of resin.

Resin molded body 20 embeds and fixes electronic component 10 at a position apart from an end portion of an upper surface 21 thereof by a predetermined distance (a distance larger than the width of resin member 30 described later). Resin molded body 20 embeds electronic component 10 such that electrodes 11 and 12 are exposed from upper surface 21.

Resin member 30 is formed around electronic component 10, and is interposed between electronic component 10 and resin molded body 20. Resin member 30 is exposed from upper surface 21 of resin molded body 20. An upper surface 31 of resin member 30 is substantially flush with surfaces of electrodes 11 and 12 of electronic component 10 exposed from resin molded body 20, and upper surface 21 of resin molded body 20. Here, the description that upper surface 31, the surfaces of electrodes 11 and 12, and upper surface 21 are substantially flush with each other means that a level difference between upper surface 31 and the surfaces of electrodes 11 and 12, and a level difference between upper surface 31 and upper surface 21 are smaller than a predetermined value to such an extent that wires 40 and 41 formed thereon are not disconnected.

A resin material constituting resin member 30 is not particularly limited, and resin member 30 is made of a material selected as appropriate depending on the product to which electronic device 1 is applied, the environment around electronic device 1, and the like. For example, when electronic device 1 is used under an environment in which temperature varies widely, resin member 30 is preferably made of a resin material having a thermal expansion coefficient which is lower than the thermal expansion coefficient of resin molded body 20 and is higher than the thermal expansion coefficient of electrodes 11 and 12. For example, resin member 30 is made of an epoxy-based or melamine-based resin material having a thermal expansion coefficient of 3 to $5 \times 10^{-5}$/K which is lower than the thermal expansion coefficient of ABS of 6 to $13 \times 10^{-5}$/K and is higher than the thermal expansion coefficient of copper or silver constituting electrodes 11 and 12 of 1.7 to $1.9 \times 10^{-5}$/K.

Alternatively, when electronic device 1 is highly likely to receive a mechanical load, resin member 30 is preferably made of an elastomer (for example, a polyester-based, styrene-based, or olefin-based elastomer), urethane acrylate, or the like having elasticity with a bending elastic modulus of 20 to 1300 MPa. The bending elastic modulus is measured according to JIS K7171.

Wires 40 and 41 are formed on upper surface 21 of resin molded body 20 and upper surface 31 of resin member 30, and are respectively connected to electrodes 11 and 12 of electronic component 10. Wire 40 is connected to electrode 11 in a manner passing over upper surface 31 of resin member 30, and wire 41 is connected to electrode 12 in a manner passing over upper surface 31 of resin member 30. The other ends of wires 40 and 41 are connected to electrodes of other electronic components not shown in electronic device 1, for example. Thereby, electronic component 10 is electrically and functionally connected to the other electronic components.

Wires 40 and 41 can be easily formed by injecting an electrically conductive liquid ink (for example, silver (Ag) nano ink) using an ink jet printing method, for example. The ink jet printing method is a printing method which injects a liquid ink from a nozzle and deposits the ink on an injection target surface. Wires 40 and 41 may be made of a material other than Ag and may be formed by another method, and the thickness, depth, and the like thereof are not particularly limited.

(Method for Manufacturing Electronic Device)

Figure 2:
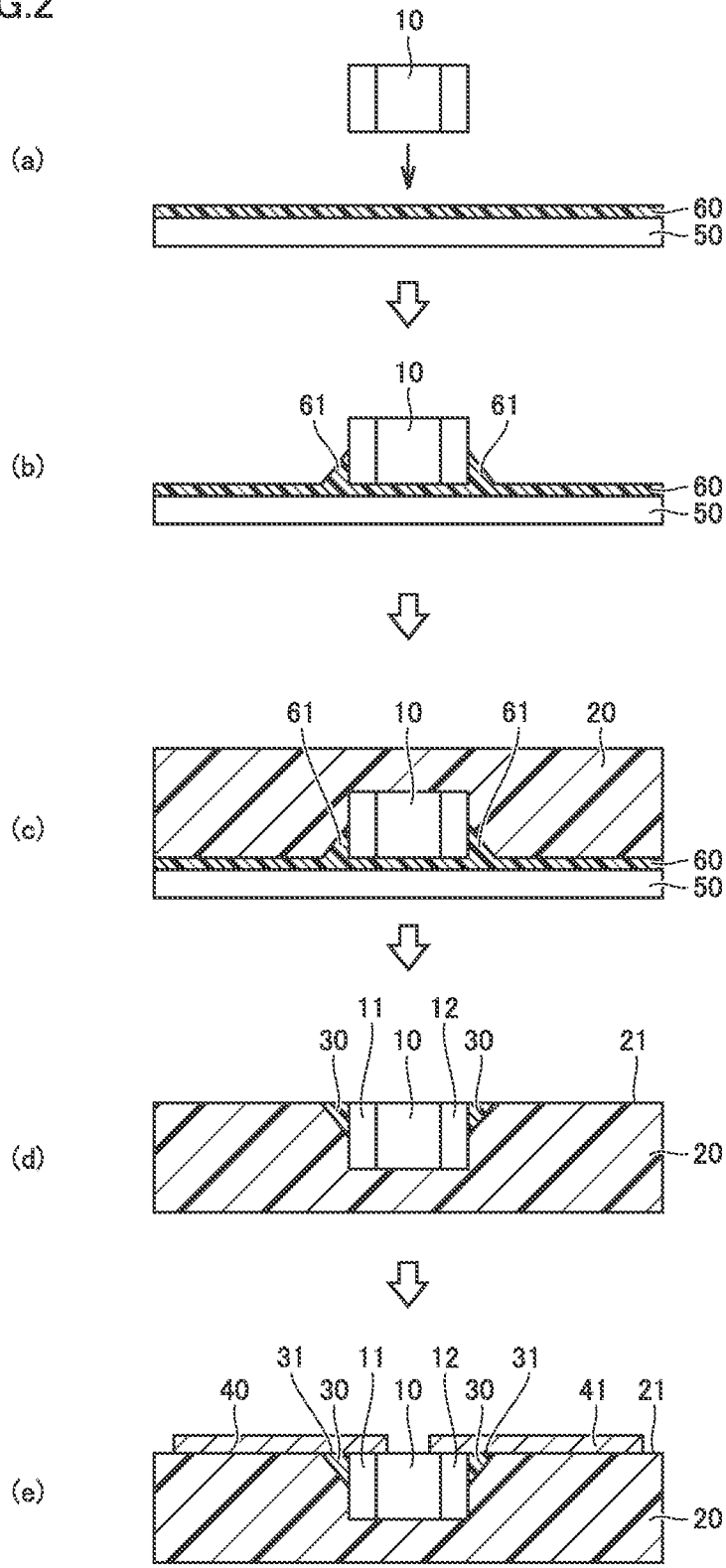
FIG. 2 is a view illustrating an example of a method for manufacturing the electronic device in accordance with the first embodiment.

Referring to FIG. 2, a method for manufacturing electronic device 1 in the first embodiment will be described. FIG. 2 is a view illustrating an example of the method for manufacturing electronic device 1 in the first embodiment.

(i) Wetting Portion Forming Step

As shown in (a) of FIG. 2, first, a sheet 50 for temporarily fixing electronic component 10 is prepared. Sheet 50 is preferably made of a material having transparency capable of transmitting ultraviolet rays, and flexibility allowing a peeling step described later to be reliably performed. For example, polyethylene terephthalate (PET), polyethylene naphthalate (PEN), polyphenylene sulfide (PPS), or the like can be used. In the present embodiment, sheet 50 is a 50 µm-thick PET sheet, for example.

An adhesive liquid layer 60 is applied on one surface of sheet 50. Liquid layer 60 is preferably the one having a short cure time, and an ultraviolet cure adhesive can be used, for example. When ultraviolet rays are emitted to the ultraviolet cure adhesive, it is cured and bonds sheet 50 and electronic component 10. Accordingly, when ultraviolet rays are emitted from the surface on which the adhesive is applied, electronic component 10 itself serves as a barrier which hinders emission of ultraviolet rays to the adhesive, which may result in insufficient curing (adhesion). Therefore, by using a material transmitting ultraviolet rays for sheet 50 and emitting ultraviolet rays from a surface of sheet 50 on which the adhesive is not applied, the adhesive is sufficiently cured and reliably fixes electronic component 10 to sheet 50 in a short time. Liquid layer 60 in the present embodiment is urethane acrylate having a bending elastic modulus of 47 MPa, for example.

As shown in (b) of FIG. 2, electronic component 10 is aligned and arranged on the surface of sheet 50 on which liquid layer 60 is applied. Specifically, electronic component 10 is arranged at a position on sheet 50 corresponding to the position apart from the end portion of upper surface 21 of resin molded body 20 by the predetermined distance. On this occasion, liquid layer 60 wets side surfaces of electronic component 10, due to surface tension thereof. Thereby, a wetting portion 61 is formed around electronic component 10.

The shape (width and height) of wetting portion 61 is determined according to the shape, size, and material of electronic component 10, and the material and surface tension of liquid layer 60. Wetting portion 61 having a desired height can be formed by adjusting the surface tension of liquid layer 60.

(ii) Wetting Portion Curing Step

After wetting portion 61 is formed, ultraviolet rays of 1000 to 3000 mJ/cm² are emitted from the surface of sheet 50 opposite to the surface thereof on which electronic component 10 is arranged. As a result, liquid layer 60 is cured, and thereby electronic component 10 is bonded and fixed to sheet 50. On this occasion, wetting portion 61 is also cured, and maintains its shape even after ultraviolet rays are emitted. Wetting portion 61 is used as resin member 30 around electronic component 10 after undergoing subsequent steps.

(iii) Injection Molding Step

After electronic component 10 is temporarily fixed to sheet 50, sheet 50 is arranged inside a molding die. This molding die is a die for injection molding resin molded body 20 having electronic component 10 embedded therein. Sheet 50 is arranged inside the molding die such that the surface of sheet 50 opposite to the surface thereof on which electronic component 10 is temporarily fixed contacts an inner surface of the molding die. In this state, a resin material such as ABS is injected under the conditions of a molding die temperature of 80° C., an injected resin temperature of 180° C., and an injection pressure of 20 kg/cm$^2$. Thereby, as shown in (c) of FIG. 2, resin molded body 20 embedding electronic component 10 and wetting portion 61 is molded.

(iv) Peeling Step

Then, as shown in (d) of FIG. 2, by peeling sheet 50 from resin molded body 20 obtained by the injection molding step, electrodes 11 and 12 of electronic component 10 are exposed from upper surface 21 of resin molded body 20 which has faced sheet 50. On this occasion, wetting portion 61 formed in the temporary fixing step is separated from sheet 50, is left between resin molded body 20 and electronic component 10, and serves as resin member 30. Separation of wetting portion 61 from sheet 50 can be easily implemented by selecting a material having good adhesion properties with the material for electronic component 10 or the material for resin molded body 20, as liquid layer 60. As a result, resin molded body 20 embedding electronic component 10 and resin member 30 arranged around electronic component 10 is formed.

(v) Wire Forming Step

Finally, as shown in (e) of FIG. 2, wires 40 and 41 connected to electrodes 11 and 12 exposed from the surface of resin molded body 20 are formed on upper surface 21 of resin molded body 20 and upper surface 31 of resin member 30. For example, wires 40 and 41 are formed using the method of injecting the electrically conductive liquid ink (for example, silver nano ink) which is the material for wires 40 and 41 (for example, the ink jet printing method). On this occasion, an ink jet head is moved such that a jet outlet of the ink jet head passes above resin member 30. Thereby, wires 40 and 41 are formed to pass over resin member 30. More specifically, wires 40 and 41 are formed to continuously cover upper surface 21 of resin molded body 20 and upper surface 31 of resin member 30. Through this step, electronic device 1 having electronic component 10 embedded in resin molded body 20 is completed.

Wires 40 and 41 may be formed using a screen printing method or a method by means of a dispenser, instead of the ink jet printing method. Further, a resist layer covering wires 40 and 41 may be formed in electronic device 1.

(Advantages)

As described above, electronic device 1 in the first embodiment includes electronic component 10 having electrodes 11 and 12, resin molded body 20 embedding electronic component 10 such that electrodes 11 and 12 are exposed, resin member 30 interposed between resin molded body 20 and electronic component 10 and exposed from resin molded body 20, and wires 40 and 41 formed on resin molded body 20 and resin member 30 and respectively connected to electrodes 11 and 12.

With the above configuration, wires 40 and 41 pass over resin member 30 and are connected to electrodes 11 and 12. The presence of resin member 30 can suppress disconnection of wires 40 and 41, when compared with a case where a large groove is formed between resin molded body 20 and electronic component 10.

Preferably, the thermal expansion coefficient of resin member 30 is lower than the thermal expansion coefficient of resin molded body 20 and is higher than the thermal expansion coefficient of electrodes 11 and 12. Thereby, even if a change in shape due to expansion or contraction occurs in resin molded body 20 due to a change in temperature around electronic device 1, a stress on wires 40 and 41 is dispersed by resin member 30 interposed between resin molded body 20 and electronic component 10. As a result, it is possible to make disconnection of wire 40 and 41 less likely to occur.

Preferably, the bending elastic modulus of resin member 30 is less than or equal to 1300 MPa. Since the bending elastic modulus of resin member 30 is less than or equal to 1300 MPa, even if a mechanical load which may enlarge the portion between resin molded body 20 and electronic component 10 is applied to electronic device 1, resin member 30 extends to follow resin molded body 20, and thus the stress on wires 40 and 41 is dispersed. As a result, it is possible to make disconnection of wire 40 and 41 less likely to occur. In addition, preferably, the bending elastic modulus of resin member 30 is more than or equal to 20 MPa. If the bending elastic modulus of resin member 30 is less than 20 MPa, the hardness (rigidity) of resin member 30 becomes too low, and defects such as cracks are more likely to occur in wires 40 and 41 formed on the surface. However, occurrence of such defects can be suppressed by setting the bending elastic modulus of resin member 30 to more than or equal to 20 MPa.

The method for manufacturing electronic device 1 in the first embodiment includes the wetting portion forming step (a first step), the wetting portion curing step (a second step), the injection molding step (a third step), the peeling step (a fourth step), and the wire forming step (a fifth step). In the wetting portion forming step, electronic component 10 having electrodes 11 and 12 is arranged on sheet 50 having the surface on which adhesive liquid layer 60 is applied, and wetting portion 61 is formed around electronic component 10 by wetting of liquid layer 60 along the side surfaces of electronic component 10. In the wetting portion curing step, wetting portion 61 is cured to form resin member 30. In the injection molding step, after resin member 30 is formed, the resin material is injected onto the surface of sheet 50 on which electronic component 10 is arranged to mold resin molded body 20 embedding electronic component 10. In the peeling step, sheet 50 is peeled from resin molded body 20 such that resin member 30 remains between resin molded body 20 and electronic component 10. In the wire forming step, wires 40 and 41 respectively connected to electrodes 11 and 12 are formed on resin molded body 20 and resin member 30.

With the above configuration, electronic device 1 including resin member 30 interposed between resin molded body 20 and electronic component 10 is easily manufactured. Wires 40 and 41 pass over resin member 30 and are connected to electrodes 11 and 12. The presence of resin member 30 can suppress disconnection of wires 40 and 41, when compared with the case where a large groove is formed between resin molded body 20 and electronic component 10.

Second Embodiment

Figure 3:
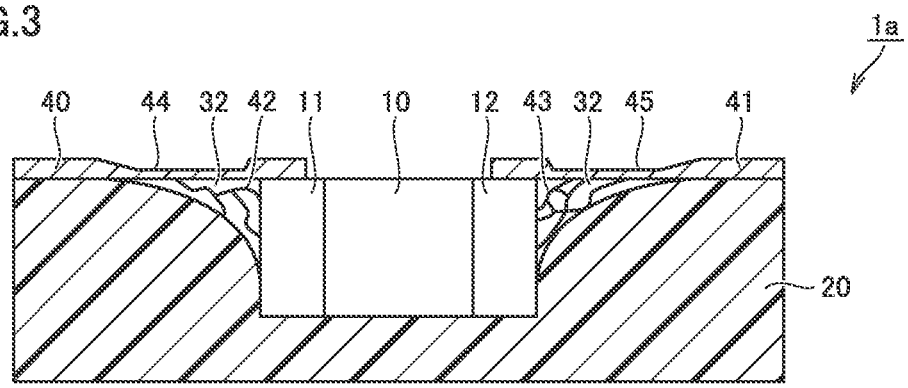
FIG. 3 is a cross sectional view showing an electronic device in accordance with a second embodiment.

An electronic device in accordance with a second embodiment will be described below. FIG. 3 is a cross sectional view showing an electronic device 1a in accordance with the second embodiment. As shown in FIG. 3, electronic device 1a is different from electronic device 1 in the first embodiment in that electronic device 1a includes a resin member 32 instead of resin member 30, and includes a multitude of electrically conducting paths 42 and 43 formed within voids inside resin member 32.

Resin member 32 is a porous resin body having a multitude of voids therein. The voids include holes and cracks inside resin member 32. The method of forming resin member 32 is the same as the method of forming resin member 30 in the first embodiment (see (a) to (c) of FIG. 2). However, an adhesive material containing a volatile liquid is used as the liquid layer to be applied to sheet 50, and the volatile liquid is volatilized by performing heat treatment when photo-curing the liquid layer. As the volatile liquid, a liquid which can be volatilized by the heat treatment (for example, vinyl ether or the like) is used.

As the liquid layer, for example, an ink material blended to contain 30 mass % of epoxy resin, 50 mass % of a vinyl ether compound, 10 mass % of an ionic liquid, and 10 mass % of the remainder is used. The remainder contains a photo cationic polymerization initiator, a stabilizer, and the like.

The ionic liquid is a non-polymeric substance including anions and cations and being liquid at room temperature (for example, 25° C.). Examples of cations include a cyclic amidine ion such as an imidazolium ion, a pyridinium ion, an ammonium ion, a sulfonium ion, and a phosphonium ion. Examples of anions include $C_nH_{2n+1}COO^-$, $C_nF_{2n-1}COO^-$, $NO_3^-$, $C_nF_{2n+1}SO_3^-$, $(C_nF_{2n+1}SO_2)_2N^-$, $(C_nF_{2n+1}SO_2)_3C^-$, $PO_4^{2-}$, $AlCl_4^-$, $Al_2Cl_7^-$, $ClO_4^-$, $BF_4^-$, $PF_6^-$, $AsF_6^-$, and $SbF_6^-$.

As the photo cationic polymerization initiator, a well-known material can be used. For example, sulfonium salt (salt of a sulfonium ion and an anion), iodonium salt (salt of an iodonium ion and an anion), selenium salt (salt of a selenium ion and an anion), ammonium salt (salt of an ammonium ion and an anion), phosphonium salt (salt of a phosphonium ion and an anion), salt of a transition metal complex ion and an anion, or the like can be used.

When the above liquid layer is photo-cured and heat-treated, the volatile liquid (vinyl ether compound) inside is volatilized, and holes corresponding to the volume of the volatile liquid, or a multitude of cracks resulting from contraction in volume are produced in wetting portion 61, forming resin member 32 having the multitude of voids.

Electrically conducting paths 42 and 43 are formed within the voids inside resin member 32. Electrically conducting paths 42 are connected to wire 40 and electrode 11. Electrically conducting paths 43 are connected to wire 41 and electrode 12.

Electrically conducting paths 42 and 43 are formed simultaneously with wires 40 and 41. Specifically, in the same step as (v) wire forming step in the first embodiment, wires 40 and 41 are formed by injecting an electrically conductive liquid ink onto resin member 32. On this occasion, due to a capillary phenomenon, a portion of the electrically conductive ink infiltrates into the voids inside resin member 32 and reaches electrode 11 or electrode 12. Thereby, electrically conducting paths 42 connected to wire 40 and electrode 11 and electrically conducting paths 43 connected to wire 41 and electrode 12 are formed within the voids of resin member 32.

A portion of the electrically conductive ink infiltrates into the voids formed in a net-like shape inside resin member 32. Accordingly, wire 40 and electrode 11 are connected by a multitude of paths. Each of the multitude of paths constitutes electrically conducting path 42. Thus, a multitude of electrically conducting paths 42 are formed between wire 40 and electrode 11. Similarly, a multitude of electrically conducting paths 43 are formed between wire 41 and electrode 12.

In portions of wires 40 and 41 above resin member 32, recesses 44 and 45 corresponding to the volume of the electrically conductive ink which has infiltrated into resin member 32 are formed. In a case where the influence of resistance increase caused by recesses 44 and 45 is unacceptable, it is only necessary to appropriately increase a supply amount of the electrically conductive ink onto resin member 32.

There is a possibility that a change in shape due to expansion or contraction may occur in resin molded body 20 for some reason (such as thermal shock, a change in ambient temperature, and a mechanical load), and cracks may occur in wires 40 and 41. Even if the cracks run to a portion of resin member 32 on this occasion, electrical connection between wire 40 and electrode 11 and electrical connection between wire 41 and electrode 12 are maintained by electrically conducting paths 42 and 43 passing through a portion where the cracks do not occur, of the multitude of electrically conducting paths 42 and 43 inside resin member 32. Thereby, reliability of the connection between wire 40 and electrode 11 and the connection between wire 41 and electrode 12 can be improved.

Third Embodiment

In the first embodiment described above, resin member 30 interposed between electronic component 10 and resin molded body 20 is formed by peeling sheet 50 from resin molded body 20 to leave wetting portion 61 on the resin molded body 20 side. In contrast, in a third embodiment, resin member 30 is formed to fill a groove around electronic component 10 formed by peeling sheet 50 together with wetting portion 61 from resin molded body 20. An electronic device in accordance with the third embodiment has the same configuration as that of electronic device 1 in accordance with the first embodiment.

Figure 4:
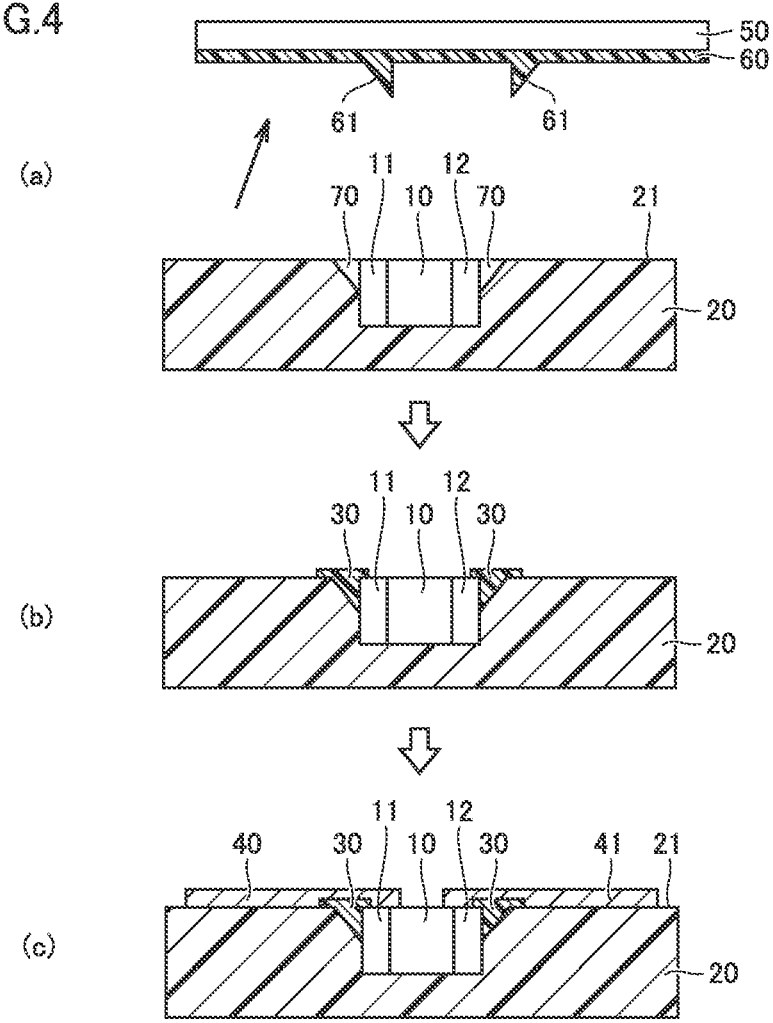
FIG. 4 is a view for illustrating a method for manufacturing an electronic device in accordance with a third embodiment.
Figure 5A:
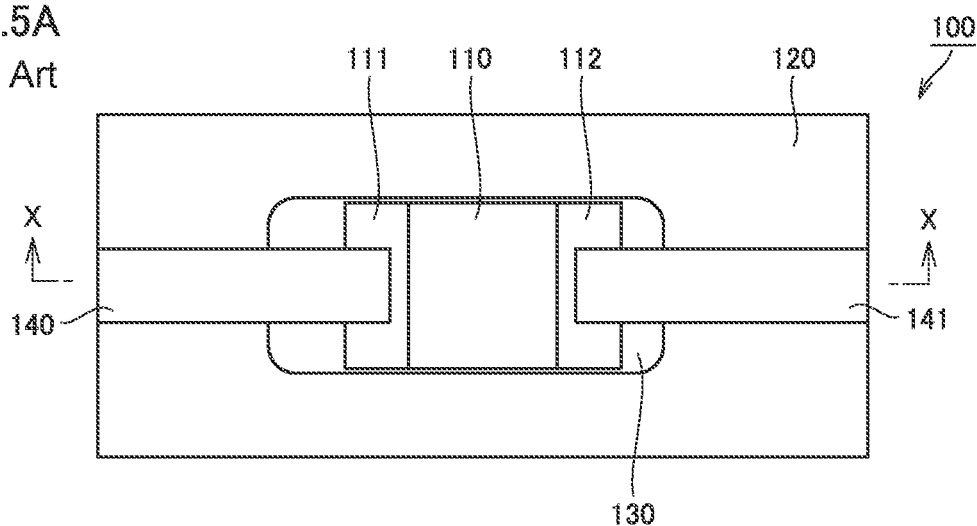
FIG. 5A is a plan view showing a conventional circuit structural body
Figure 5B:
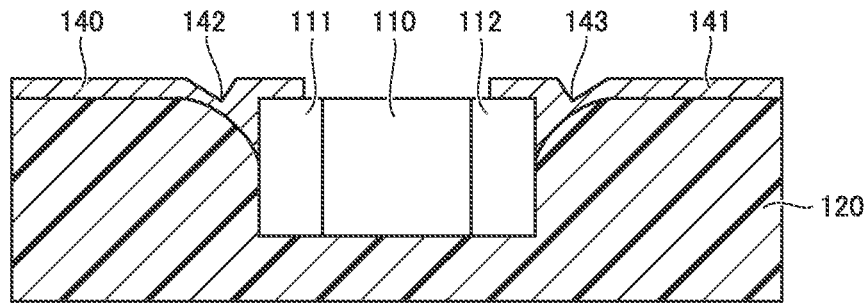
FIG. 5B is a cross sectional view taken along a line X-X in FIG. 5A and viewed in the direction of arrows.
Figure 6A:
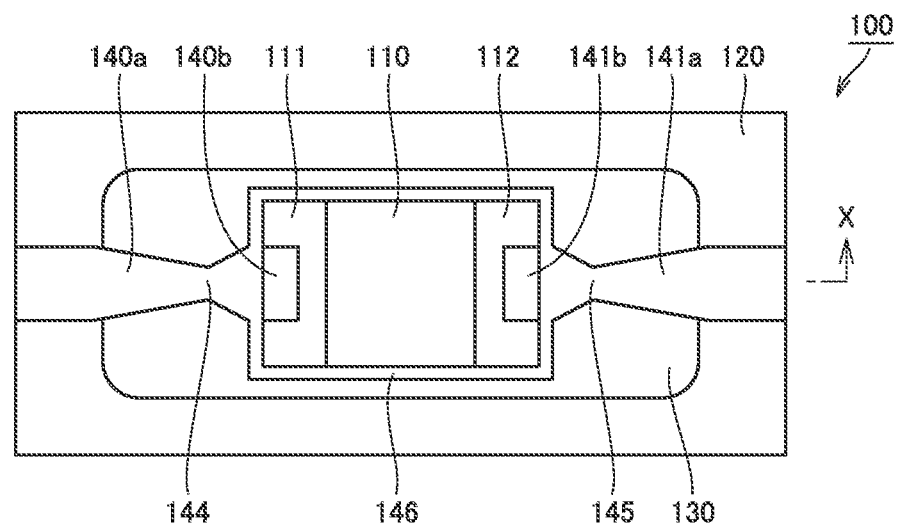
FIG. 6A is a plan view showing the circuit structural body having a groove larger than an appropriate size formed therein.
Figure 6B:
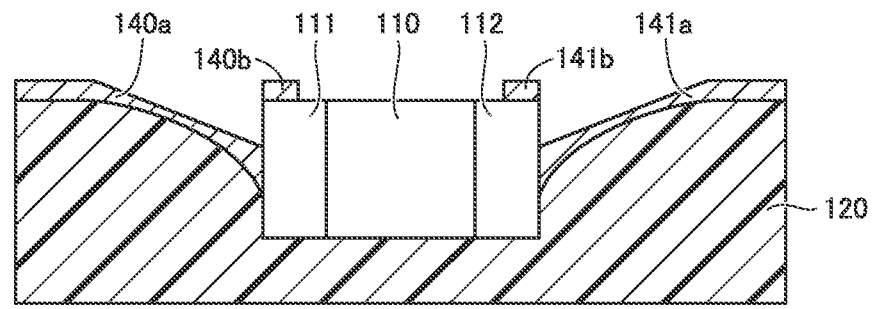
FIG. 6B is a cross sectional view taken along a line X-X in FIG. 6A and viewed in the direction of arrows.

Referring to FIGS. 2 and 4, a method for manufacturing the electronic device in accordance with the third embodiment will be described. FIG. 4 is a view for illustrating the method for manufacturing the electronic device in accordance with the third embodiment.

First, by performing (i) wetting portion forming step to (iii) injection molding step in the first embodiment as shown in (a) to (c) of FIG. 2, resin molded body 20 embedding electronic component 10 and wetting portion 61 is molded. However, as the material for adhesive liquid layer 60 constituting wetting portion 61, a material whose adhesive strength with sheet 50 is stronger than that of the material in the first embodiment and whose adhesive strength with resin molded body 20 is weaker than that of the material in the first embodiment is selected.

(iv) Peeling Step

Then, by peeling sheet 50 from resin molded body 20 obtained by the injection molding step, electrodes 11 and 12 of electronic component 10 are exposed from upper surface 21 of resin molded body 20 which has faced sheet 50 On this occasion, as shown in (a) of FIG. 4, wetting portion 61 formed in the temporary fixing step is peeled, together with sheet 50, from resin molded body 20. Thereby, a groove 70 conforming to the shape of wetting portion 61 is formed around electronic component 10 in resin molded body 20.

(v) Resin Member Forming Step

Then, as shown in (b) of FIG. 4, a resin material is supplied to fill groove 70 around electronic component 10 to form resin member 30 conforming to the shape of groove 70. As the resin material for resin member 30, the material for liquid layer 60 in the first embodiment can be used. The resin material is supplied into groove 70 using the ink jet printing method as in (v) wire forming step in the first embodiment, and is cured by emission of ultraviolet rays or heat treatment.

Although resin member 30 may be formed to protrude from groove 70, resin member 30 is formed so as not to entirely cover electrodes 11 and 12.

Finally, as shown in (c) of FIG. 4, wires 40 and 41 connected to electrodes 11 and 12 exposed from the surface of resin molded body 20 are formed on upper surface 21 of resin molded body 20 and resin member 30. Since this step is the same as (v) wire forming step in the first embodiment, a detailed description thereof is omitted.

As described above, the method for manufacturing the electronic device in the third embodiment includes the peeling step and the resin member forming step, in addition to (i) wetting portion forming step to (iii) injection molding step and (v) wire forming step in the first embodiment. In the peeling step, by peeing sheet 50 and wetting portion 61 from resin molded body 20, groove 70 conforming to the shape of wetting portion 61 is formed around electronic component 10 in resin molded body 20. In the resin member forming step, resin member 30 is formed to fill groove 70. Thereby, the electronic device including resin member 30 interposed between resin molded body 20 and electronic component 10, and including wires 40 and 41 formed to pass over resin member 30 can be easily manufactured.

In the resin member forming step, as the resin material to be supplied into groove 70 around electronic component 10, a material containing a volatile substance may be used, as with the liquid layer in the second embodiment. Thereby, resin member 32 having voids therein can be formed, as in the second embodiment. Thereafter, by infiltrating an electrically conductive material constituting wires 40 and 41 into the voids in the wire forming step, electrically conducting paths 42 connected to wire 40 and electrode 11 and electrically conducting paths 43 connected to wire 41 and electrode 12 are formed inside resin member 32.

It should be understood that the embodiments disclosed herein are illustrative and non-restrictive in every respect. The scope of the present invention is defined by the scope of the claims, rather than the description above, and is intended to include any modifications within the scope and meaning equivalent to the scope of the claims.

REFERENCE SIGNS LIST 1, 1a: electronic device; 10, 110: electronic component; 11, 12, 111, 112: electrode; 20, 120: resin molded body; 21, 31: upper surface; 30, 32: resin member; 40, 41, 140, 140a, 140b, 141, 141a, 141b: wire; 42, 43: electrically conducting path, 44, 45, 142, 143: recess; 50: sheet; 60: liquid layer; 61: wetting portion; 70, 130: groove; 100: circuit structural body; 144, 145: thin wire portion; 146: short circuit.

The invention claimed is:

1. A method for manufacturing an electronic device including
   an electronic component having electrodes,
   a resin molded body embedding the electronic component such that the electrodes are exposed,
   a resin member interposed between the resin molded body and the electronic component and exposed from the resin molded body, and
   wires formed on the resin molded body and the resin member and connected to the electrodes,
   the method comprising:
   a first step of arranging the electronic component on a sheet having a surface on which an adhesive liquid layer is applied, and forming a wetting portion around the electronic component by wetting of the adhesive liquid layer along side surfaces of the electronic component;
   a second step of curing the wetting portion;
   a third step of injecting a first resin material onto the surface of the sheet on which the electronic component is arranged, and thereby molding the resin molded body embedding the electronic component;
   a fourth step of peeling the sheet and the wetting portion from the resin molded body, and thereby forming a groove conforming to a shape of the wetting portion around the electronic component in the resin molded body;
   a fifth step of supplying a second resin material to fill the groove, curing the second resin material, and forming the resin member; and
   a sixth step of forming the wires on the resin molded body and the resin member.

2. An electronic device comprising:
   an electronic component having electrodes;
   a resin molded body embedding the electronic component such that the electrodes are exposed;
   a resin member interposed between the resin molded body and the electronic component and exposed from the resin molded body; and
   wires formed on the resin molded body and the resin member and connected to the electrodes, wherein
   a thermal expansion coefficient of the resin member is lower than a thermal expansion coefficient of the resin molded body and is higher than a thermal expansion coefficient of the electrodes.

3. The method for manufacturing the electronic device according to claim 1, wherein
   the second resin material contains a volatile substance,
   voids are formed inside the resin member by volatilizing the volatile substance when curing the second resin material in the fifth step, and
   electrically conducting paths connected to the wires and the electrodes are formed inside the resin member by infiltrating an electrically conductive material constituting the wires into the voids in the sixth step.

4. An electronic device comprising:
   an electronic component having electrodes;
   a resin molded body embedding the electronic component such that the electrodes are exposed;
   a resin member interposed between the resin molded body and the electronic component and exposed from the resin molded body; and
   wires formed on the resin molded body and the resin member and connected to the electrodes, wherein
   the resin member has voids therein, and the electronic device further comprises electrically conducting paths formed within the voids and connected to the wires and the electrodes.

5. A method for manufacturing an electronic device including
an electronic component having electrodes,
a resin molded body embedding the electronic component such that the electrodes are exposed,
a resin member interposed between the resin molded body and the electronic component and exposed from the resin molded body, and
wires formed on the resin molded body and the resin member and connected to the electrodes,
the method comprising:
a first step of arranging the electronic component on a sheet having a surface on which an adhesive liquid layer is applied, and forming a wetting portion around the electronic component by wetting of the adhesive liquid layer along side surfaces of the electronic component;
a second step of curing the wetting portion and forming the resin member;
a third step of injecting a resin material onto the surface of the sheet on which the electronic component is arranged and molding the resin molded body, after forming the resin member;
a fourth step of peeling the sheet from the resin molded body such that the resin member remains between the resin molded body and the electronic component; and
a fifth step of forming the wires on the resin molded body and the resin member.

6. The method for manufacturing the electronic device according to claim 5, wherein
the adhesive liquid layer contains a volatile substance,
voids are formed inside the resin member by volatilizing the volatile substance when curing the wetting portion in the second step, and
electrically conducting paths connected to the wires and the electrodes are formed inside the resin member by infiltrating an electrically conductive material constituting the wires into the voids in the fifth step.

* * * * *